United States Patent [19]
Henrich et al.

[11] Patent Number: 4,511,852
[45] Date of Patent: Apr. 16, 1985

[54] DIFFERENTIAL AMPLIFIER HAVING BALANCED OUTPUT

[75] Inventors: Kenneth J. Henrich, Kings Park; Thomas C. Hana, E. Patchoque, both of N.Y.

[73] Assignee: Hazeltine Corporation, Commack, N.Y.

[21] Appl. No.: 462,174

[22] Filed: Jan. 31, 1983

[51] Int. Cl.³ .............................................. H03F 3/45
[52] U.S. Cl. ................................. 330/252; 330/151; 330/301
[58] Field of Search ............... 330/254, 259, 261, 290, 330/296, 307, 275, 295, 301, 252, 151

[56] References Cited

U.S. PATENT DOCUMENTS 3,838,210  9/1974  Peil ................................... 330/254 X
4,146,844  3/1979  Quinn .............................. 330/151 X

OTHER PUBLICATIONS

Faulkenberry, Luces M., *An Introduction to Op Amps*, 2nd ed., Wiley & Sons, 1977, p. 16.

Primary Examiner—James B. Mullins
Assistant Examiner—Steven J. Mottola
Attorney, Agent, or Firm—E. A. Onders; F. R. Agovino

[57] ABSTRACT

A classical differential amplifier provides outputs of unequal magnitude due to its emitter resistance being finite. In order to equalize its output, a voltage follower circuit is associated with each of the inputs of the differential amplifier. The output of each voltage follower circuit is converted to a current and subtracted from one of the outputs of the differential amplifier. Subtracting the outputs results in a differential amplifier with both outputs being substantially equal.

15 Claims, 6 Drawing Figures $$G_{11} = \frac{V_o}{V_{in}} = \frac{R_c}{R_{e1} + R_{e2}//R_{cm}} \quad (1)$$

$$R_{e2}//R_{cm} = \frac{1}{\frac{1}{R_e} + \frac{1}{R_{cm}}} = \frac{R_{e2} R_{cm}}{R_{e2} + R_{cm}} \quad (2)$$

$$G_{11} = \frac{V_o^-}{V_{in}} = \frac{R_c/R_e}{1 + \frac{R_{cm}}{R_e + R_{cm}}} \quad (3)$$

$$I_e(Q11) = \frac{V_{in}}{R_e + R_e//R_{cm}} \quad (4)$$

$$I_e(Q12) = I_e(Q11) \frac{1/R_{e2}}{1/R_{e2} + 1/R_{cm}} \quad (5)$$

$$\frac{R_{e2}//R_{cm}}{R_{e1}} = \frac{R_{cm}}{R_e + R_{cm}} = 1 - \frac{R_e}{R_e + R_{cm}} \quad (6)$$

$$G_{11} = \left|\frac{V_o^-}{V_{in}}\right| > \left|\frac{V_o^+}{V_{in}}\right| = G_{12} \quad (7)$$

$$G_{21} = \frac{V_o^-}{V_{in}} = -\frac{R_c}{R_e}\left(1 + \frac{R_e}{R_{b2}}\right) \quad (8)$$

$$G_{22} = \frac{V_o^+}{V_{in}} = \frac{R_c}{R_e} \quad (9)$$

FIG. 4

DIFFERENTIAL AMPLIFIER HAVING BALANCED OUTPUT

BACKGROUND OF THE INVENTION

1. Field of the Invention

The invention relates generally to differential amplifiers and, in particular, to amplifiers providing balanced, or equal and opposite outputs when one input is driven.

2. Description of the Prior Art

Conventional differential amplifiers as illustrated in FIG. 1, do not produce equal amplitude outputs when one input is driven and the other input is AC grounded. Specifically, differential amplifier DA, having gain K, as inputs 13 and 16 and outputs 14 and 15. Input 12 is coupled 15 to a voltage generator providing a voltage $V_{in}$ and output 13 is grounded through capacitor 16. Inputs 12 and 13 are also properly DC biased. As a result, the voltage available at output 14 is equal to $[K/(1+d)]V_{in}$ and the voltage available at output 15 is equal to $-KV_{in}$. Therefore, noninverted ouptput 14 has a magnitude which is less by amount $KdV_{in}/(1+d)$ than the magnitude of inverted output 15.

FIG. 2 illustrates a circuit diagram for a conventional differential amplifier. In general, a voltage $V_{in}$ is applied to the base of transistor Q11 and the base of the transistor Q12 is grounded through bypass capacitor $C_{BP}$. In this configuration transistor Q12 functions as a common-base amplifier and transistor Q11 functions as a voltage follower. Considering the emitter of transistor Q12 as AC grounded, the gain $G_{11}$ of stage 11 including transistor Q11 is related to the collector impedance which is equal to resistor $R_{c1}$, and the emitter impedance which is equal to the series combination of emitter resistance $R_{e1}$ and the parallel combination of resistor $R_{e2}$ and resistor $R_{cm}$ where $R_{e1}=R_{e2}=R_e$. Therefore, the gain $G_{11}$ of stage 11 is given by formula 1 (see FIG. 4) where the parallel combination of emitter resistor $R_{e2}$ and resistor $R_{cm}$ is given by formula 2. Substituting formula 2 into formula 1 illustrates that gain $G_{11}$ of stage 11 is equal to the ratio of $$\frac{-R_c/R_e}{1 + R_{cm}/(R_e + R_{cm})}$$

since transistor Q12 is a common-base stage (see formula 3). As the value of resistor $R_{cm}$ approaches infinity, gain $G_{11}$ approaches $-R_c/2R_e$. Therefore, resistor $R_{cm}$, due to its parallel relationship with resistor $R_{e2}$, causes gain $G_{11}$ to be greater than this limit value.

This must be compared with the gain of stage 12. Stage 12 includes transistor Q12 in a common base mode with the emitter functioning as a summing junction. Thus, all currents into the emitter will be summed and appear at the collector. When considering transistor Q12, transistor Q11 is regarded as a voltage follower with the emitter resistors converting the emitter voltage of transistor Q11 into a current for application to the emitter of transistor Q12. The emitter current $I_e(Q11)$ of transistor Q11 is as shown in formula 4. However, not all of this current reaches the emitter of transistor Q12 because some of the current is shunted to ground by resistor $R_{cm}$. As a result, the current $I_e(Q12)$ into the emitter of transistor Q12 is shown by formula 5. As shown in formula 6, this reduces current $I_e(Q11)$ applied to the emitter of Q12 and, therefore, the gain of $G_{12}$ is reduced by an amount equal to $R_e/(R_e+R_{cm})$. The conclusion is that the magnitude of gain $G_{11}$ in stage 11 is always greater than the magnitude of gain $G_{12}$ through stage 12 as illustrated in formula 7.

Another conventional configuration of a differential amplifier is shown in FIG. 3. Following a similar pattern of analysis as indicated above with regard to FIG. 2, gain $G_{21}$ for stage 21 including transistor Q21 is shown by formula 8 and gain $G_{22}$ for stage 22 including transistor Q22 is shown by formula 9. Once again, the magnitude of gain $G_{21}$ of stage 21 is greater than the magnitude of the gain $G_{22}$ of stage 22.

In the classical circuits illustrated in FIGS. 2 and 3, the additional gain to the $V_0$-output stage is due to an extra emitter current component. The additional emitter current component of the circuit in FIG. 2 is due to the emitter resistor $R_{cm}$, while the additional emitter current component in the circuit in FIG. 3 is due to resistor $R_{b1}$. To eliminate these components, resistor $R_{cm}$, $R_{b1}$ and $R_{b2}$ must become infinitely large. However, this is very difficult to achieve at high frequencies such as frequencies in the range of 300 MHz.

SUMMARY OF THE INVENTION

It is an object of this invention to provide a differential amplifier having outputs which are substantially equal in magnitude.

The invention comprises an apparatus including a differential amplifier having gain K, with first and second inputs and first and second outputs. A first voltage follower circuit is associated with the first input of the differential amplifier, the first circuit having an output. A second voltage follower circuit is associated with the second input of the differential amplifier, the second circuit having an output. First means for summing has inputs associated with the first output of the amplifier and the output of the second circuit, and has an output providing a voltage substantially representing the sum of the outputs associated with the inputs of the first means. Second means for summing has inputs associated with the second output of the amplifier and the output of the first circuit, and has an output providing a voltage substantially representing to the sum of the outputs associated with the inputs of the second means. Grounding the first input of the amplifier and applying a positive voltage V to the second input results in the output of the first means providing a voltage substantially equal to the output of the second means.

For a better understanding of the present invention, together with other and further objects, reference is made to the following description, taken in conjunction with the accompanying drawings, and its scope will be pointed out in the appended claims.

BRIEF DESCRIPTION OF THE DRAWINGS

FIG. 4 is a table of the formula representing the analysis of FIGS. 2 and 3.

DETAILED DESCRIPTION OF THE INVENTION

Figure 1:
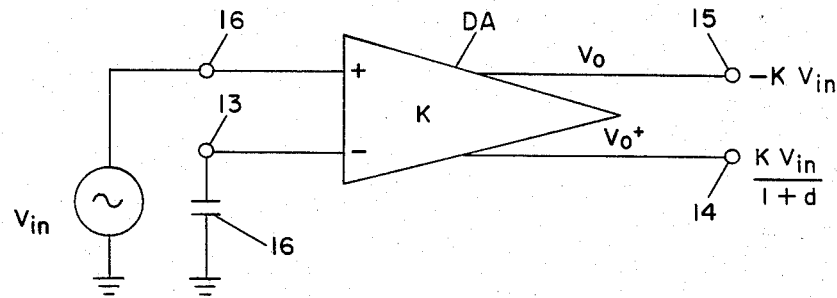
FIG. 1 is a block diagram of a differential amplifier according to the prior art.
Figure 2:
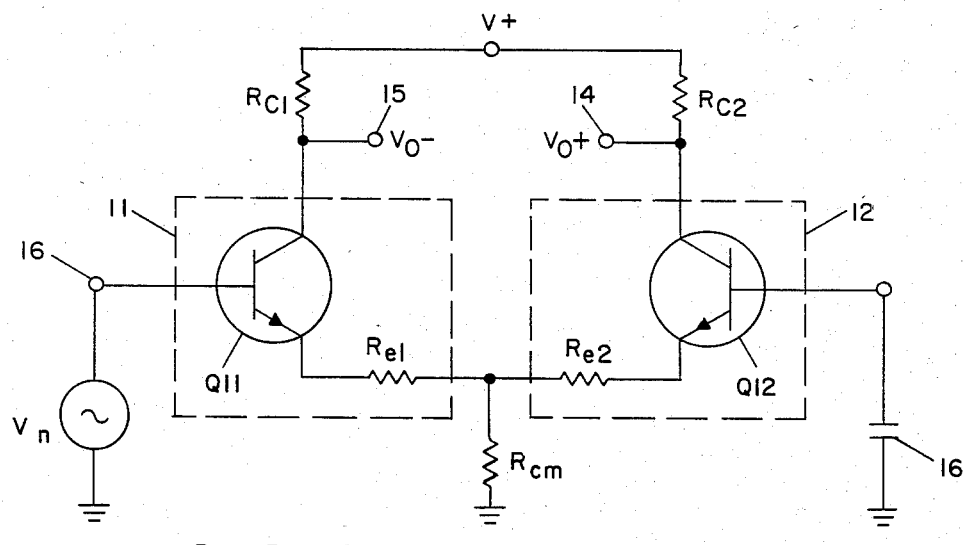
FIG. 2 is a schematic diagram of a conventional differential amplifier according to the prior art.
Figure 3:
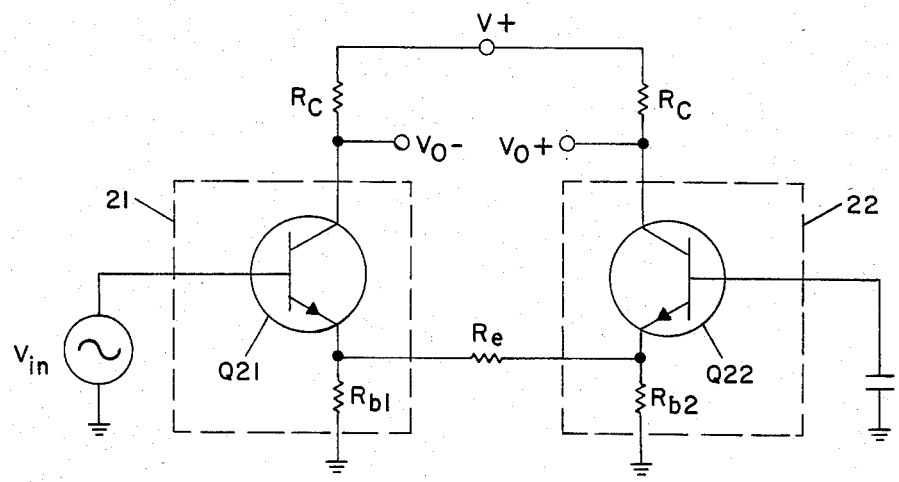
FIG. 3 is a schematic diagram of another conventional differential amplifier according to the prior art.
Figure 5:
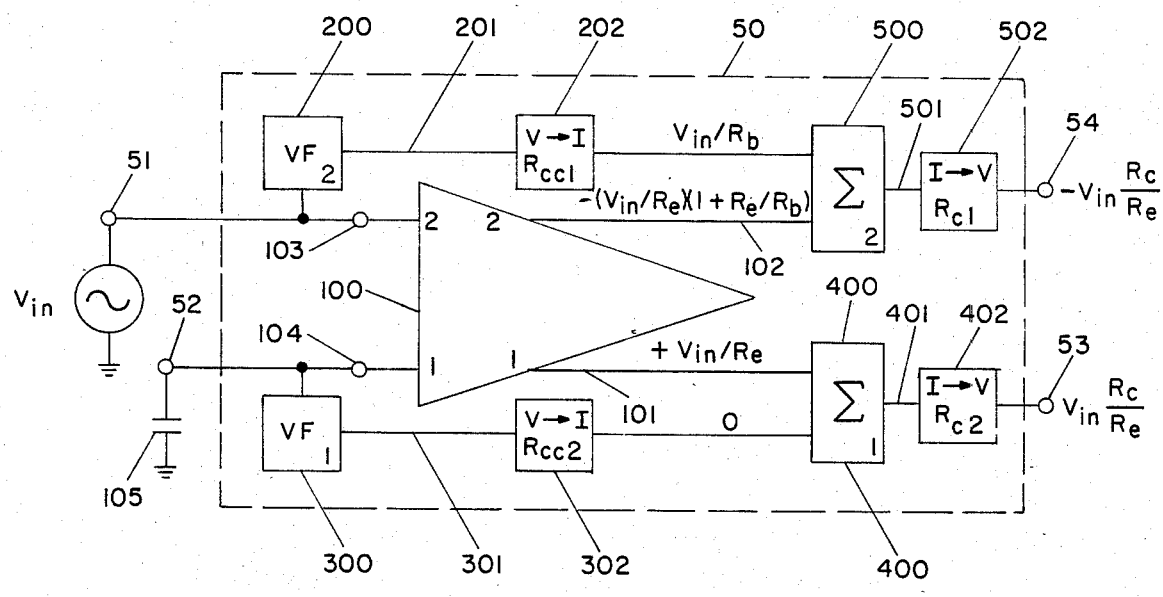
FIG. 5 is a block diagram of a differential amplifier according to the invention.

As illustrated in FIG. 5, the differential amplifier 50 according to the invention includes a prior art differential current amplifier 100. Amplifier 100 has a first output port 101 which provides a current equal to $+V_{in}/R_e$ and a second output port 102 providing current $(-V_{in}/Re)(1+R_e/R_b)$. Therefore, as shown above in the analysis of the classical circuits illustrated in the FIGS. 1-3, the gain at output port 102 is greater than the gain at output port 101.

Voltage follower circuit 200 is associated with input 103 of current amplifier 100 and has an output 201 which provides a voltage to current converter 202 which converts the voltage into a current equal to $V_{in}/R_{cc1}$. This current is applied to current summer 500 for summing with the output current from output port 102. Similarly, voltage follower circuit 300 is associated with input 104 of current amplifier 100 and has an output 301 which provides a voltage to current converter 302 which converts the voltage into a current which is summed by current summer 400 with the output current from output port 101.

When a voltage such as voltage $V_{in}$ is applied to input 103 and input 104 is grounded through bypass capacitor 105, voltage follower 200 provides a voltage at output 201 equal to $V_{in}$ to converter 202. Since input 104 is AC grounded, output 301 of voltage follower circuit 300 is zero. Essentially, voltage follower 300 is included so that differential amplifier 50 is a symmetrical network and a voltage can be applied to either input 51 or input 52. Output 401 of current summer 400 provides a current equivalent to the voltage supplied by output 301 of converter 302 (which is zero in the FIG. 5 circuit) added to the current supplied by output 101 of current amplifier 100 (which is $+V_{in}/R_e$ in the FIG. 5 circuit). Output 401 of summer 400 provides a current to converter 402 which converts the current into a voltage equal to $V_{in}R_c/R_e$. Similarly, current summer 500 sums the currents provided by output 102 $(-V_{in}/R_e)(1+R_e/Rb)$ and the output of converter 202 $(V_{in}/Rb)$ so that output 501 provides a current to converter 502 which converts the current into a voltage equal to $-V_{in}R_c/R_e$. (This implies $R_b$ equals $R_c$. However, FIG. 5 illustrates a first order approximation. Secondary and tertiary terms which modify $R_c$ result in $R_b = R_c$.) As a result, the output voltage at output port 53 of amplifier 50 is substantially equal and opposite to the output voltage at output port 54 of amplifier 50.

Figure 6:
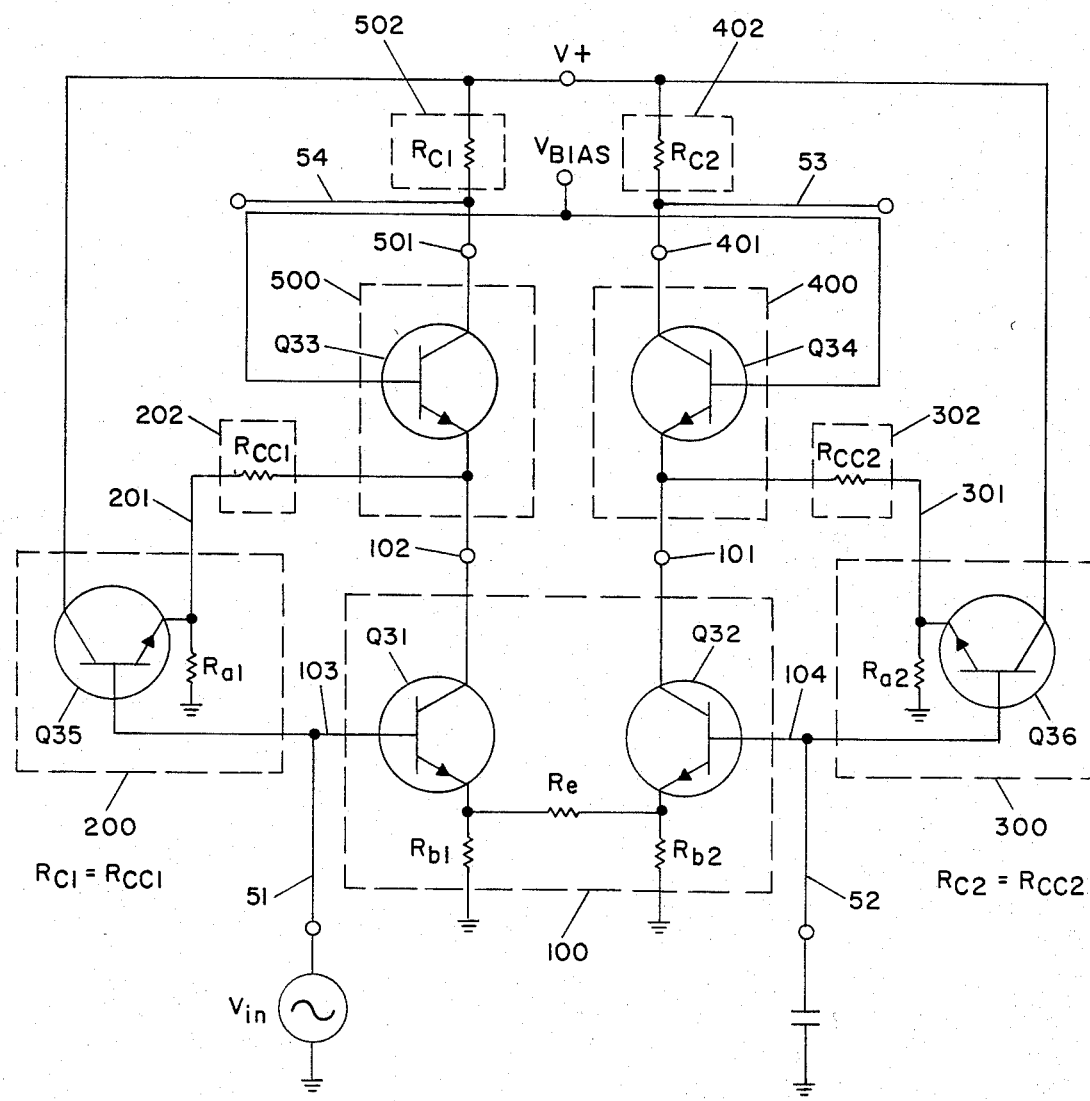
FIG. 6 is a schematic diagram of a differential amplifier according to the invention.

FIG. 6 illustrates a schematic diagram for the differential amplifier of FIG. 5. Summers 400 and 500 include transistors Q33 and Q34, respectively, which are common-base stages used as current summers. Voltage follower circuits 200 and 300 include transistors Q35 and Q36 with emitters which are DC biased through resistors $R_{a1}$ and $R_{a2}$, respectively, which are voltage followers duplicating the voltage follower role of transistors Q32 and Q31, respectively, of current amplifier 100. The DC quiescent condition of voltage follower circuits 200 and 300, including transistors Q35 and Q36, respectively, is maintained as closely as possible to the quiescent condition for transistors Q32 and Q31, respectively, of current amplifier 100. In this way, these four transistors will have the best matched AC performance. The voltage supplied at output 201 of voltage follower 200 is applied to converter 202 (i.e. compensating resistor $R_{cc1}$) which converts the voltage to an equivalent current for summation by current summer 500 along with the current provided by output 102 of current amplifier 100. The voltage supplied at output 301 of voltage follower 300 is applied to converter 302 (i.e. compensating resistor $R_{c2}$) which converts the voltage to an equivalent current for summation by current summer 500 along with the current provided by output 101 of current amplifier 100.

Compensation resistors $R_{cc1}$ and $R_{cc2}$ are used to reduce the gain of transistors Q31 and Q32, respectively, of amplifier 100 so that it is equal to the gain of transistors Q32 and Q31, respectively. The extra gain of transistor Q31, as pointed out above, is due to biasing resistor $R_{b2}$. When the base of transistor Q31 goes high, a current component equal to $V_{in}/R_{b2}$ is created causing the collector current of transistor Q31 to increase. To offset this AC current component, current is supplied from transistor Q35 through $R_{c1}$ to diminish the AC emitter current of transistor Q34. This effectively lowers the gain of transistor Q31 without affecting the gain of transistor Q32. When the input voltage $V_{in}$ is applied to input 52 and input 51 is capacitively grounded, the extra gain of transistor Q32 is due to biasing resistor $R_{b1}$ and compensating resistor $R_{cc2}$ diminishes the emitter current of transistor Q32.

Compensation resistor $R_{cc1}$ should have a value equal to resistor $R_{b2}$ and $R_{cc2}$ should equal $R_{b1}$. This would cause total cancellation. However, at high frequencies, the current-transfer ratios of transistors Q31 and Q32 decrease and the simplifying assumptions become less valid.

The circuit of FIG. 5 was computer analyzed at 300 MHz with the use of a circuit simulation software package. In an iterative analysis, compensation resistor $R_{c1}$ was found to be somewhat less than resistor $R_{b2}$. This is due to the more comprehensive modeling available in computer simulation which accurately predicts performance better than manual calculations using simplifying assumptions.

The results of simulation analysis indicate that a differential amplifier which is more perfect than the conventional differential amplifier can be achieved. Circuit performance will produce complementary outputs with amplitudes within 0.1 db of each other. In addition, frequency response is symmetrical at frequencies less than 450 MHz.

One embodiment of the differential amplifier invention may be as part of an unpackaged monolithic large scale integrated microcircuit chip. Such a chip may function to transfer signals from surface acoustic wave delay line taps to either of two summing buses in accordance with coded data input control signals. The chip would also differentially add the two summing bus output signals and provide in-phase and out-of-phase output signals of this addition. For example, such a chip may be used to switch 32 independent RF inputs to one of two summing buses (A or B) in accordance with the data information input to a shift register of the chip. The explicit operation is as follows for any RF input: if $Q_n$ is high, then signal $RF_n$ is switched to bus A; if, however, $Q_n$ is low, then $RF_n$ is switched to bus B. The input data may be serially shifted into a 32 bit static serial in, serial out/parallel out register by the positive edge of clock. All external input/output signals are TTL compatable. The parallel outputs are connected to switch control latches which are loaded on the high level of a transfer pulse. The Q inputs and Q outputs of the switch control latches operate the RF switches.

Such an arrangement is possible because (1) the switching transistors of the invention are grounded base stages and the RF operating frequency of the IC transfer chip is in the range of 60 to 300 MHz; and (2) the impedance of the RF source is very high compared to the input impedance of the grounded base stages (which is required to be 125 ohms or less, essentially resistive). The two summing bus signals may be differentially added at the output side of the chip to supply in-phase and out-of-phase output signals of the resultant.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An apparatus comprising:
   a. A differential amplifier having a gain with first and second inputs and first and second outputs;
   b. A first voltage follower circuit having a first amplifier, said first circuit associated with the first input and having an output;
   c. A second voltage follower circuit having a second amplifier, said second circuit associated with the second input and having an output;
   d. First means for summing having inputs associated with the first output of the differential amplifier and the output of the first voltage follower circuit, and having an output providing a voltage substantially representing the sum of the outputs associated with its inputs;
   e. Second means for summing having inputs associated with the second output of the differential amplifier and the output of the second voltage follower, and having an output providing a voltage substantially representing the sum of the outputs associated with its inputs, whereby the grounding of the first input of the differential amplifier and applying a positive voltage to the second input of the differential amplifier results in the output of the first means providing a voltage substantially equal to the output of the second means.

2. The apparatus of claim 1 wherein said differential amplifier comprises a current amplifier including first and second transistors having coupled emitters, the base of the first transistor forming the first input of the amplifier, the base of the second transistor forming the second input of the amplifier, the collector of the first transistor forming the first output of the amplifier and the collector of the second transistor forming the second output of the amplifier whereby applying a positive voltage V to the base of the second transistor and grounding the base of the first transistor results in the second transistor functioning as a common-base amplifier and further results in the first transistor functioning as a voltage follower circuit.

3. The apparatus of claim 2 wherein said first voltage follower circuit duplicates the voltage follower function of the first transistor of the differential amplifier.

4. The apparatus of claim 3 wherein the emitters of the first and second transistors are coupled through a first resistor and wherein said first voltage follower circuit comprises a third transistor having a base coupled to the base of the first transistor and having an emitter coupled through a first compensating resistor to one of the inputs of the first means.

5. The apparatus of claim 4 wherein applying a positive voltage V to the base of the first transistor and grounding the base of the second transistor results in the first transistor functioning as a common-base amplifier and further results in the second transistor functioning as a voltage follower circuit.

6. The apparatus of claim 5 wherein said second voltage follower circuit duplicates the voltage function of the second transistor of the differential amplifier.

7. The apparatus of claim 6 wherein said second voltage follower circuit comprises a fourth transistor having a base coupled to the base of the second transistor and having an emitter coupled through a second compensating resistor to one of the inputs of the second means.

8. The apparatus of claim 7 wherein said second compensating resistor has a resistance substantially equal to the resistance of the first compensating resistor.

9. The apparatus of claim 8 wherein said first means is a common base transistor stage having a third compensating resistor connected to its emitter.

10. The apparatus of claim 9 wherein said second means is a common base transistor stage having a fourth compensating resistor connected to its emitter.

11. The apparatus of claim 10 wherein said first, second, third and fourth compensating resistors are substantially equal.

12. The apparatus of claim 1 wherein said amplifier, said voltage follower circuits and said first and second means comprise an integrated circuit.

13. The apparatus of claim 4 wherein said amplifier, said voltage follower circuits and said first and second means comprise an integrated circuit.

14. The apparatus of claim 8 wherein said amplifier, said voltage follower circuits and said first and second means comprise an integrated circuit.

15. The apparatus of claim 11 wherein said amplifier, said voltage follower circuits and said first and second means comprise an integrated circuit.

* * * * *